US006613239B2

(12) United States Patent
Glovatsky et al.

(10) Patent No.: US 6,613,239 B2
(45) Date of Patent: Sep. 2, 2003

(54) METHOD FOR MAKING AN ELECTRICAL CIRCUIT BOARD

(75) Inventors: Andrew Z. Glovatsky, Plymouth, MI (US); Robert E. Belke, West Bloomfield, MI (US); Delin Li, San Jose, CA (US); Lakhi N. Goenka, Ann Arbor, MI (US); Mohan R. Paruchuri, Canton, MI (US); Marc A. Straub, Dearborn Heights, MI (US); Richard K. McMillan, Dearborn, MI (US); Ram S. Raghava, Ann Arbor, MI (US); Thomas B. Krautheim, Belleville, MI (US); Michael A. Howey, Canton, MI (US); Vivek A. Jairazbhoy, Farmington Hills, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 193 days.

(21) Appl. No.: 09/836,644

(22) Filed: Apr. 17, 2001

(65) Prior Publication Data

US 2002/0148809 A1 Oct. 17, 2002

Related U.S. Application Data

(60) Provisional application No. 60/207,647, filed on Mar. 26, 2000.

(51) Int. Cl.$^{7}$ .............................. B44C 1/22; C23F 1/02

(52) U.S. Cl. .............................. 216/13; 216/17; 216/41; 174/250; 29/846

(58) Field of Search .............................. 216/13, 17, 41; 174/250; 29/846

(56) References Cited

U.S. PATENT DOCUMENTS

| | | | | | |
|---|---|---|---|---|---|
| 3,801,388 | A | | 4/1974 | Akiyama et al. | |
| 4,404,059 | A | | 9/1983 | Livshits et al. | |
| 4,642,160 | A | * | 2/1987 | Burgess | 216/18 |
| 4,679,122 | A | * | 7/1987 | Belke et al. | 361/792 |
| 5,709,805 | A | * | 1/1998 | Davis et al. | 216/18 |
| 5,738,797 | A | | 4/1998 | Belke, Jr. et al. | |

FOREIGN PATENT DOCUMENTS

| | | | | |
|---|---|---|---|---|
| JP | 407336051 A | * | 12/1995 | H05K/3/46 |

* cited by examiner

*Primary Examiner*—Benjamin L. Utech
*Assistant Examiner*—Shamim Ahmed
(74) *Attorney, Agent, or Firm*—Visteon Global Tech, Inc.

(57) ABSTRACT

A method 10 for making multi-layer electronic circuit boards having metallized apertures 34, 36 which may be selectively and electrically grounded or isolated from an electrical ground plane.

16 Claims, 7 Drawing Sheets

METHOD FOR MAKING AN ELECTRICAL CIRCUIT BOARD

This application claims benefit of Provisional No. 60/203,647 filed May 26, 2000.

FIELD OF THE INVENTION

The present invention relates to a method for making an electrical circuit board and more particularly, to a method for making a multi-layer electrical circuit board having apertures which are formed through the board and/or through various portions of the board, and which may be selectively connected and/or detached and/or isolated from an electrical ground plane and/or from a source of an electrical ground potential.

BACKGROUND OF THE INVENTION

Multi-layer circuit boards contain and/or include electrical components which selectively and operatively populate opposed top and bottom surfaces of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of some or all of the various contained components.

This desired interconnection typically requires that one or more holes be drilled through each of the circuit boards, thereby creating at least one "through hole" or "via" lying and/or traversing between some or all of the opposed component containing surfaces, and through some or all of the various component containing interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow for communication of electrical power signals by and between the board surfaces and/or by and between the board surfaces and the interior component containing portions.

There is therefore a need to provide a method for producing a multi-layer electrical circuit board which overcomes some or all of the previously delineated drawbacks and which selectively allows grounded and non-ground "vias" to be desirably and selectively formed.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques and which allows for the selective, efficient, and reliable formation of metalized apertures which allows for communication by and between some or all of the various component containing surfaces and portions of the formed multi-layer electrical circuit board, which selectively allows components contained within and/or upon these portions and surfaces to be interconnected, and which is further adapted to selectively and communicatively receive an electrical component.

It is a third object of the invention to provide a method for producing a multi-layer electrical circuit board which overcomes some or all of the previously delineated drawbacks of prior multi-layer electrical circuit board forming methodologies and techniques and which allows for the selective formation of metalized apertures which may be selectively connected or disconnected and/or isolated from a selectively formed electrical ground plane or bus.

According to a first aspect of the present invention a method for making a multi-layer electrical circuit board is provided. The method includes the steps of providing a core member having a first surface and a second surface; applying an etch resistant dielectric material to the first surface of the core member, thereby creating at least a first and a second exposed portion of the first surface of the core member; applying an etch resistant dielectric material to the second surface of the core member, thereby creating at least a first, second, third, and fourth exposed portion of the second surface of the core member, the first exposed portion of the second surface and the second exposed portion of the second surface being respectively aligned with the first and second exposed portions of the first surface; and selectively applying an etchant material to the first and second surfaces of the core member, thereby creating a first aperture through the aligned first exposed portions of the first and second surfaces, creating a second aperture through the aligned second exposed portions of the first and second surfaces, creating a first recess which extends through the third exposed portion of the second surface of the core member and which terminates upon the etch resistant dielectric material residing upon the first surface of the core member, and creating a second recess which extends through the fourth exposed portion on the second surface of the core member and which terminates upon the etch resistant dielectric material residing upon the first surface of the core member, thereby forming a circuit board.

According to a second aspect of the present invention a circuit assembly is provided. The circuit assembly is made by the process of providing a core member having a first and second surface; applying a photo resistive material to the first and the second surface; removing some of the previously applied photo resistive material, thereby allowing only first and second portions of the previously applied photo resistive material to remain upon the first surface and allowing only third, fourth, fifth, and sixth portions of the previously applied photo resistive material to remain upon the second surface, the first portion being aligned with the third portion and the second portion being aligned with the fourth portion; applying a substantially dry adhesive material to the first and second surfaces; removing the first, second, third, fourth, fifth and sixth portions of the photo resistive material; and applying an etchant material to the first and second surfaces, thereby creating first and second apertures which extend through the core member and first and second recesses within the core member, thereby forming a circuit board.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
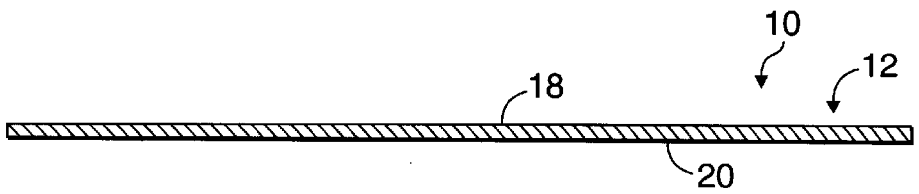
FIGS. 1(*a*)–(*h*) are successive sectional side views of a multi-layer circuit board being produced and/or formed in accordance with the teachings of the preferred embodiment of the invention.
Figure 1B:
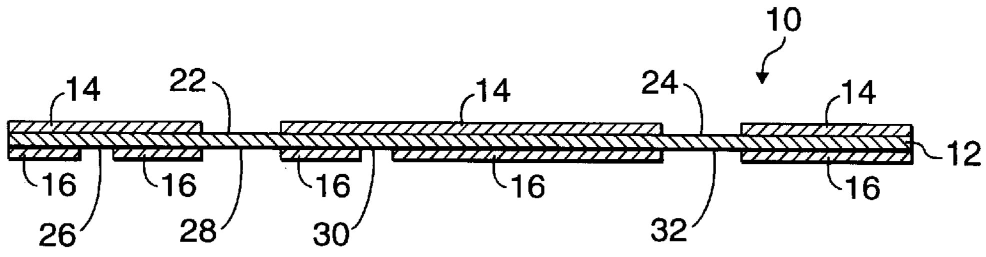
Figure 1C:
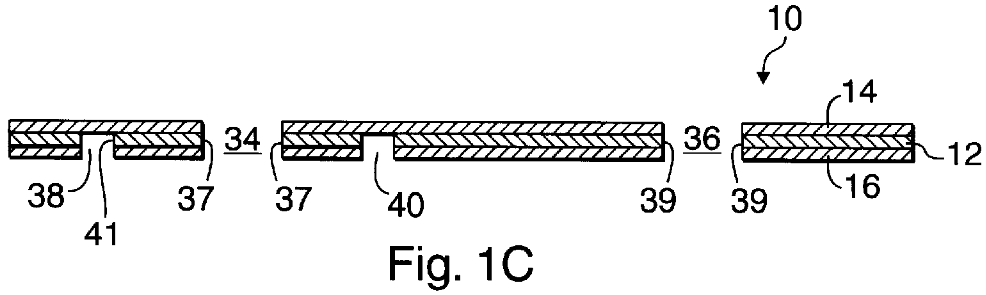
Figure 1D:
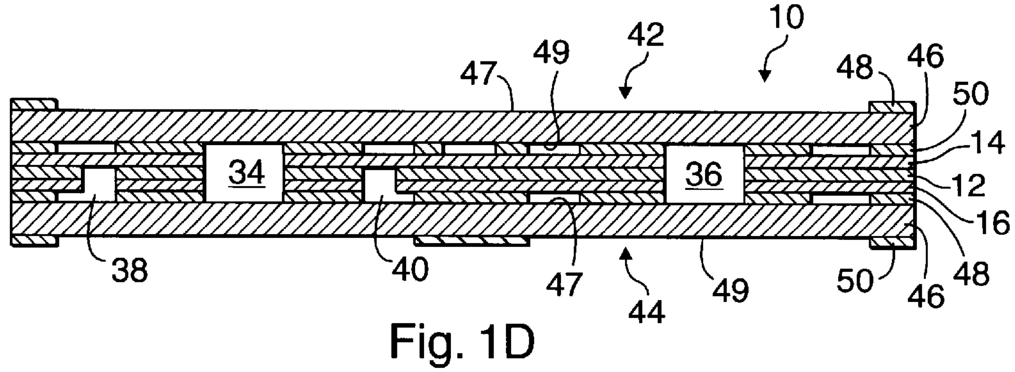
Figure 1E:
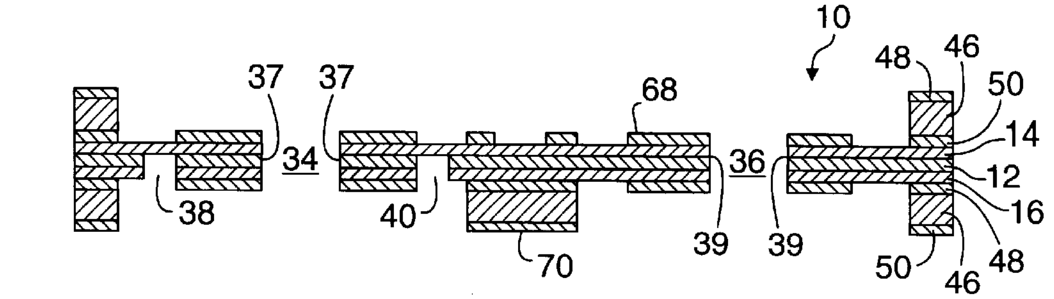
Figure 1F:
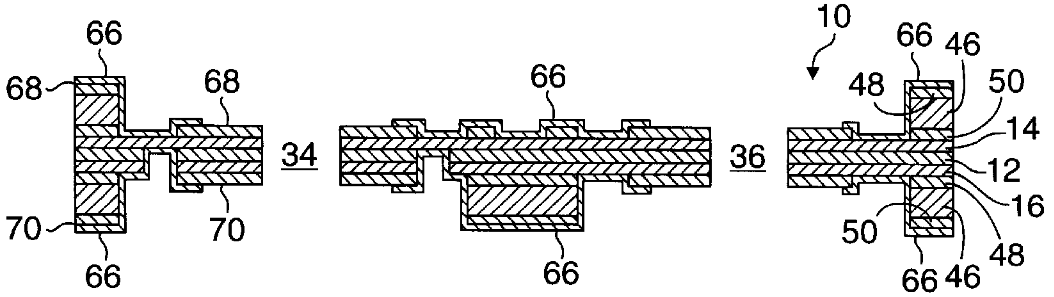
Figure 1G:
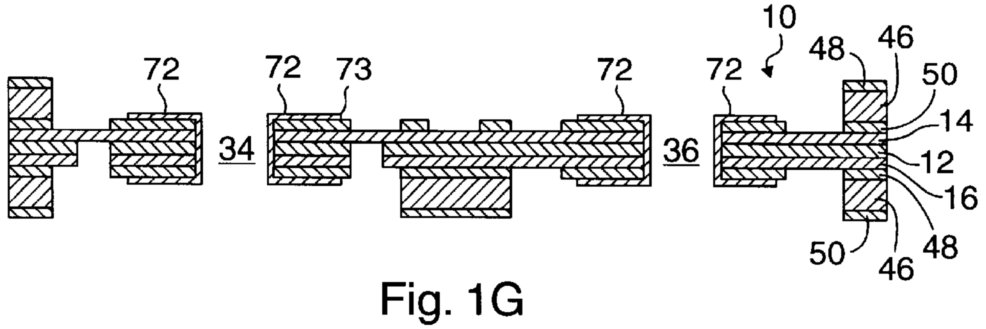
Figure 1H:
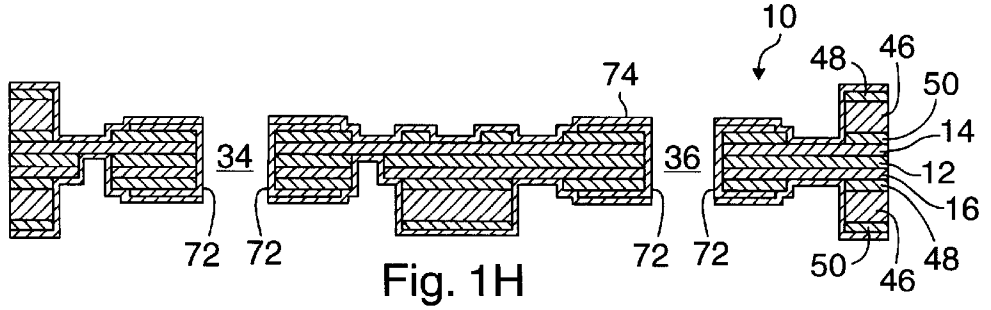
Figure 2A:
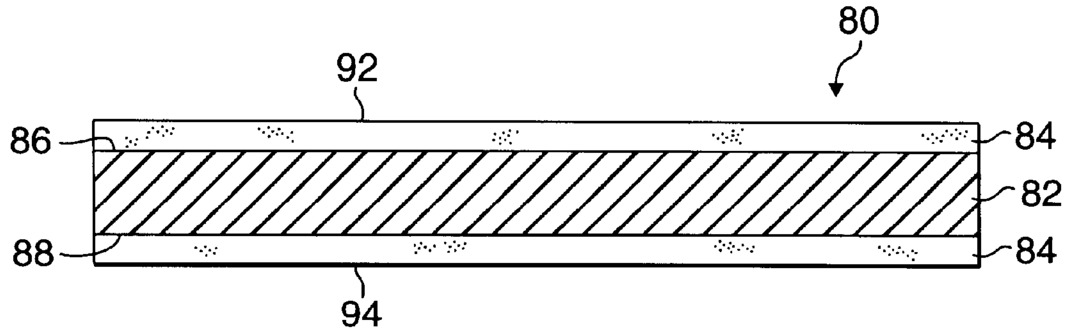
FIGS. 2(*a*)–(*e*) are successive sectional side views of a multi-layer circuit board being produced and/or formed in accordance with the teachings of a second embodiment of the invention.
Figure 2B:
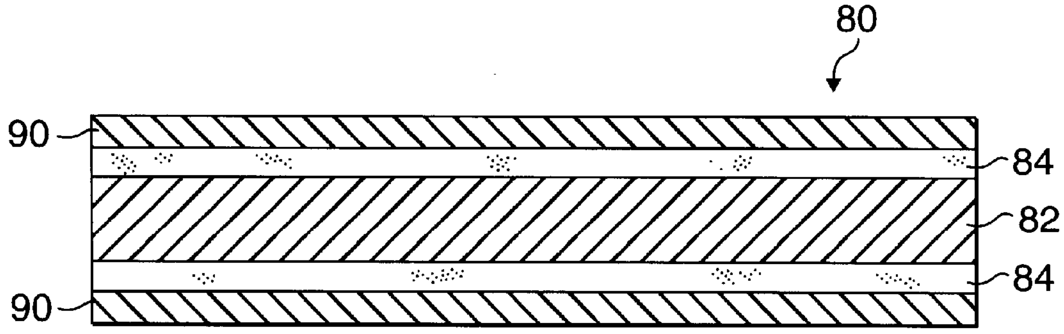
Figure 2C:
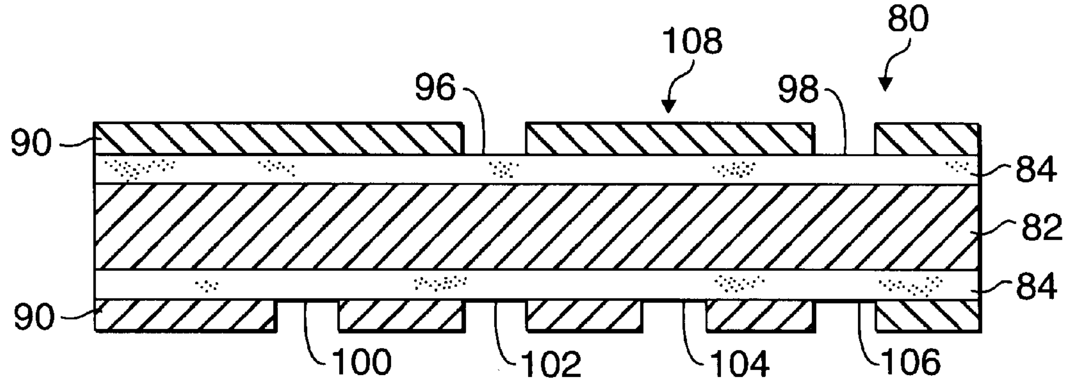
Figure 2D:
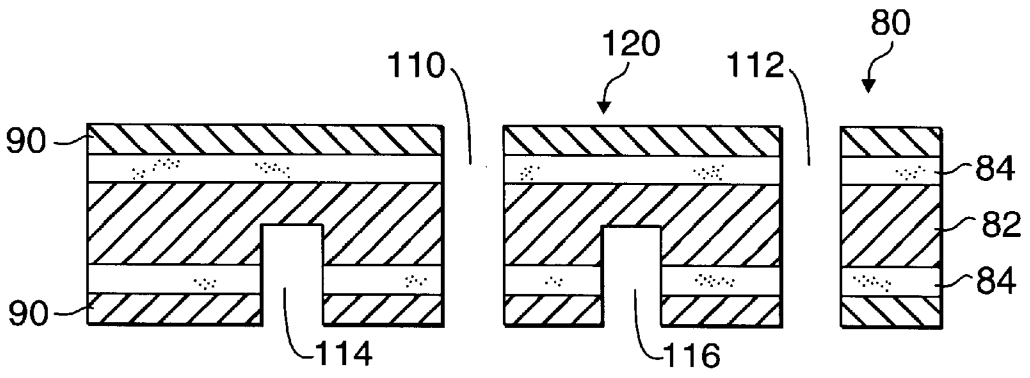
Figure 2E:
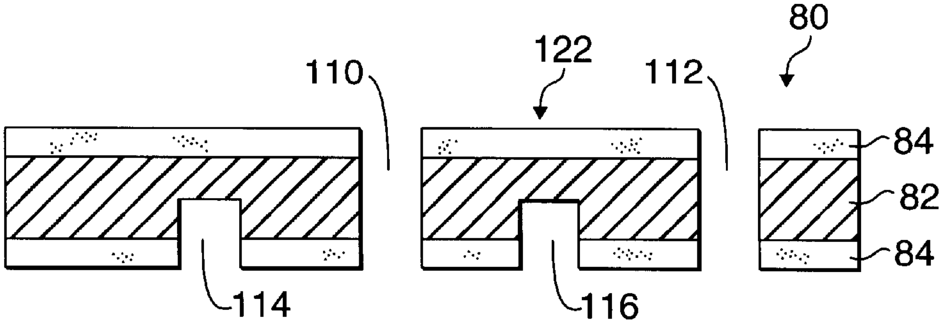
Figure 3A:
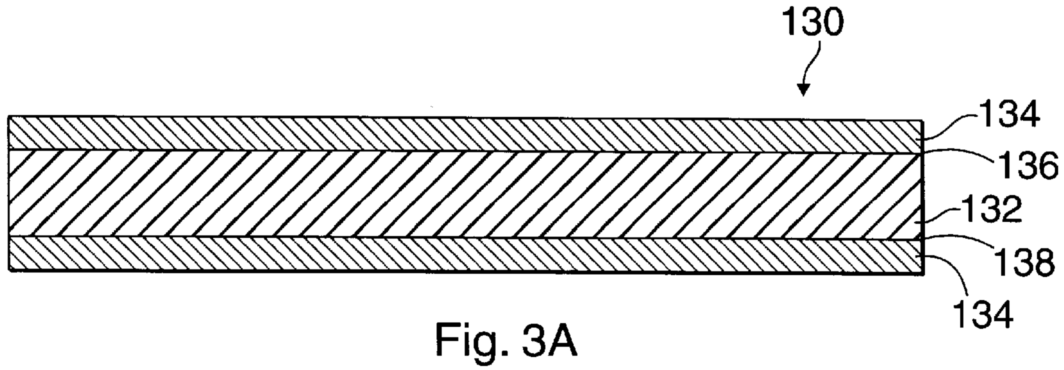
FIGS. 3(*a*)–(*e*) are successive sectional side views of a multi-layer circuit board being produced and/or formed in accordance with the teachings of a third embodiment of the invention.
Figure 3B:
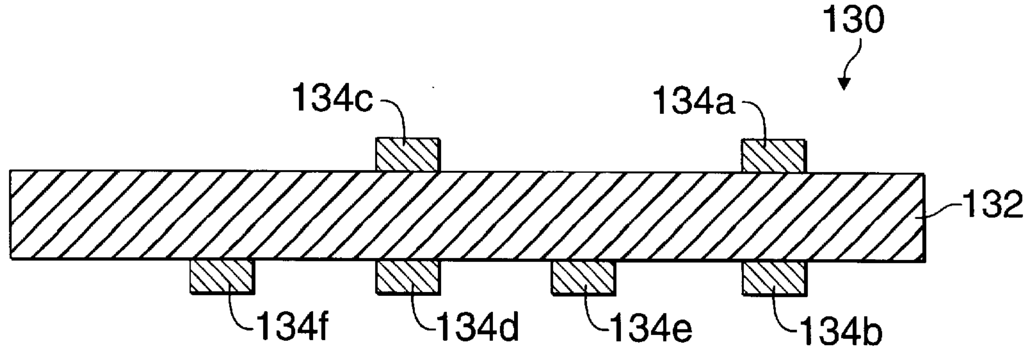
Figure 3C:
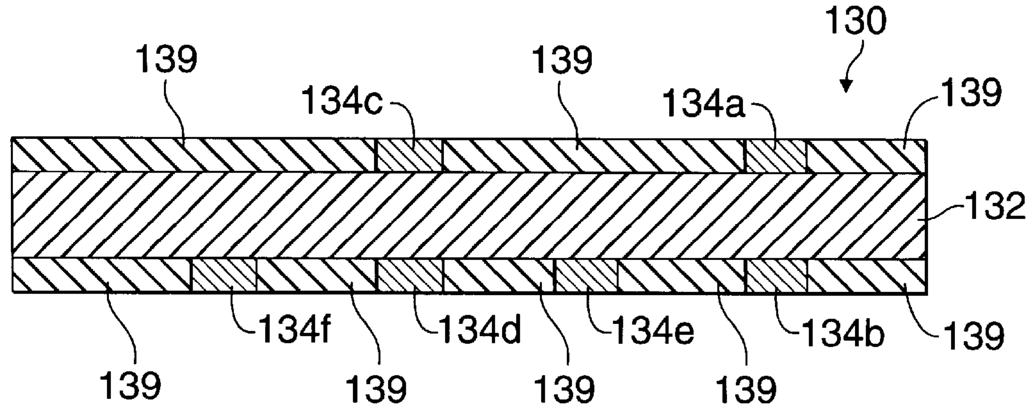
Figure 3D:
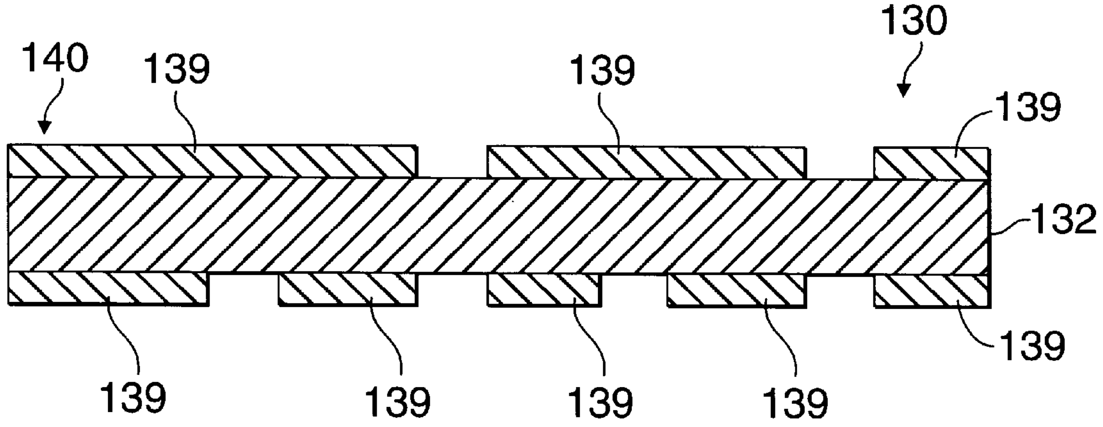
Figure 3E:
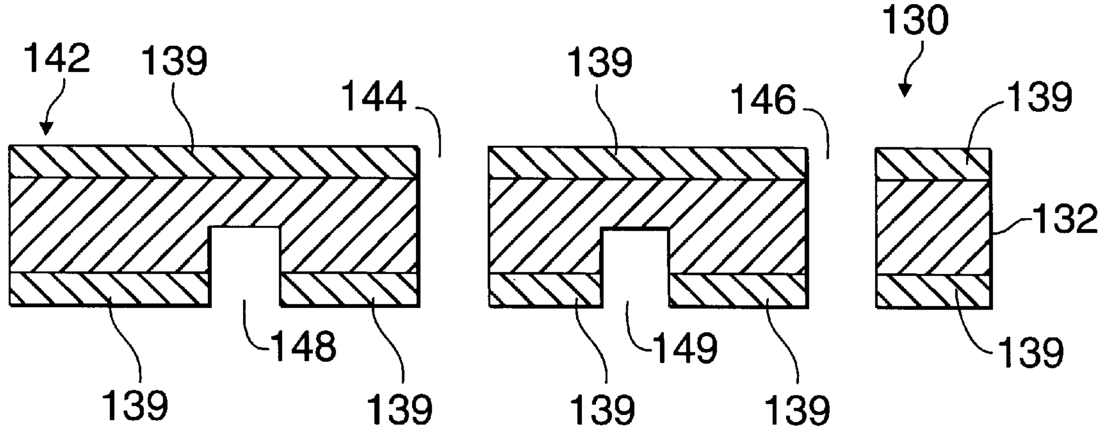

Referring now to FIGS. 1(*a*)–(*h*), there is shown a method and/or a process 10 for selectively forming a multi-layer electrical circuit board in accordance with the teachings of the preferred embodiment of the invention. Specifically, as shown best in FIG. 1(*a*), the circuit board formation or creation process 10 begins with the acquisition and/or creation of a foil member or a core member 12 which, in one non-limiting embodiment of the invention, is electrically conductive and generally rectangular in shape. In this non-limiting embodiment, core or foil member 12 comprises a copper strip or a metallic/electrically conductive foil.

The second step of process 10, as shown best in FIG. 1(*b*), requires that a certain commercially available dielectric etch resistant material 14, 16 be respectively placed upon certain portions of the top surface 18 and the bottom surface 20 of member 12 by a conventional printing process, thereby creating exposed top surface portions 22, 24 and exposed bottom surface portions 26, 28, 30, and 32. In the preferred embodiment of the invention, exposed portions 22 and 28 are aligned (e.g., portion 28 is substantially and wholly positioned under and is substantially identical in size and shape to portion 22). Further, in the preferred embodiment of the invention, portions 24 and 32 are also aligned (e.g., portion 32 is substantially and wholly positioned under and is substantially identical in size and shape to portion 24). Portions 26 and 30 are operatively formed on opposite sides of portion 28 and, as will be further delineated below, cooperatively and selectively allow for the creation of a "non-ground via" or an electrically isolated "perforation" or aperture within the metal core member 12.

In the third step of process 10, as shown best in FIG. 1(*c*), the "pre-circuit" or "pre-circuit board" assembly which was created upon the completion of the second process step shown in FIG. 1(*b*), is selectively immersed in a conventional and commercially available etchant material, effective to remove and/or "etch away" the "unprotected" portions of member 12 (e.g., those portions which are not "overlayed" with and/or covered by material 14 or 16). This etching process creates apertures and/or perforations 34, 36 through the respectively aligned and exposed portion pairs 22, 28; and 24, 32 and through the metal foil or core member 12. The selectively created apertures 34, 36 are "metalized". That is, apertures 34, 36 are formed within metal core member 12 and therefore portions, such as portions 37, 39 of member 12, respectively reside within and/or "bound" the selectively formed apertures 34, 36. Additionally, the etchant removes the exposed portions 26, 30 of member 12 and creates recesses 38, 40 within the circuit assembly which "extend through" material 16 and member 12 and which terminate within and/or "upon" the printed dielectric etch resistant material 14 which resides upon the top surface 18 of the core member 12. Recesses 38, 40 are formed on opposite sides of the aperture 34.

The circuit assembly which is shown in FIG. 1(*c*) and which is cooperatively formed by the first three steps of the process 10, may be utilized as a circuit board and may be selectively and operatively populated by electrical components. In this arrangement, member 12 is electrically coupled to a source of electrical ground potential, thereby providing an electrical ground potential "within" aperture 36 (i.e., upon surface 39) and allowing and/or causing aperture 36 to form a "grounded" via or "through hole". This selectively applied electrical ground potential is not communicatively coupled to portion 37, such communication being substantially prevented by recesses 38, 40 which cause member 12 to be discontinuous between surface 39 and surface 37 and between surface 37 and surface 41 and which, more particularly, isolates/disconnects surface 37 of member 12 from the surface or portion of member 12 which receives the electrical ground potential. Hence, aperture 34 is a "non-grounded" via or "through hole". Alternatively, the created circuit assembly, which is shown in FIG. 1(*c*), may be utilized as a "pre-circuit" or "pre-circuit board" assembly and may be further processed in accordance with the various other process steps which are illustrated in FIGS. 1(*d*)–1(*h*) and which are included within process 10.

The fourth step of process 10 is shown in FIG. 1(*d*) and, in this fourth step, the multi-layer electrical circuit board or "pre-circuit" board which was formed within the third process step (i.e., shown in FIG. 1(*c*)), is selectively "grown" as additional layers are selectively added to the electrical board assembly or "pre-circuit" assembly which was formed in the third step of process 10.

As shown, "pre-formed circuit assemblies" 42, 44 are selectively attached to the circuit board or "precircuit" board assembly which was created in the third step of process 10 and which is shown in FIG. 1(*c*). In this non-limiting embodiment, each "pre-formed circuit assembly" 42, 44 respectively includes a central portion or a core member 46 which, in one non-limiting embodiment of the invention, is dissimilar to core member 12. In one non-limiting embodiment, each portion or core member 46 is substantially identical and comprises conventional and commercially available aluminum. Alternatively, each portion 46 and member 12 are substantially identical. Each "pre-circuit assembly" 42, 44 further includes substantially identical members or portions 48, 50 which, in one embodiment of the invention, comprise metal or some other type of electrically conductive material, such as copper. Hence, portions 48, 50 may be substantially similar to core member 12. Alternatively, portions 48, 50 may be substantially identical to portions or members 46. As shown, portions 48 reside upon selected portions of the top surface 47 of each respective member 46 while portions 50 reside upon selective portions or regions of the bottom surface 49 of each respective member 46.

Each of the portions 50 of "pre-formed" electrical circuit assembly 42 are attached to a unique dielectric portion 14 of the circuit board or "pre-circuit" assembly which was previously formed at the conclusion of the third step of process 10. Portions 48 of the "preformed" circuit assembly 44 are similarly attached to unique dielectric portions 16 of the "pre-circuit" or circuit board assembly which was formed in the third step of process 10. In this manner, portions 46 of the "preformed" circuit assemblies 42 and 44 cooperatively overlay and close apertures 34 and 36. Recesses 38 and 40 are similarly closed by portion 46 of the "pre-formed" circuit assembly 44.

In the fifth step of the process 10, which is best shown in FIG. 1(*e*), the "pre-circuit assembly" which was created upon the completion of the fourth process step and which is best illustrated in FIG. 1(*d*), is selectively immersed in and/or subjected to a conventional and commercially available etchant material (e.g., an aluminum etchant material) which substantially removes or "etches away" the portion 46 of each of the "pre-formed" circuit assemblies 42, 44 which has not been "protected by" and/or which does not respectively receive one of the portions 48, 50.

In this manner, apertures 34, 36 are made to extendably traverse through the formed "pre-circuit" board assembly and, more particularly, through member 12 and members 46 of respective "pre-formed" circuit assemblies 42, 44, thereby adding additional layers to the previously formed "pre-circuit" board assembly which was formed upon the completion of the fourth process step and thereby lengthening the previously formed apertures 34, 36. Recesses 38, 40 are similarly lengthened as they respectively extend through the "pre-formed" circuit board assembly 44 (e.g., through core member 46 and material and/or portions 48, 50). It should be realized that the extended apertures 34 and 36 and recesses 38, 40 have been formed without drilling and therefore allow an "aperture containing" circuit and/or a "pre-circuit" to be formed in a manner which overcomes the various drawbacks associated with prior drilling methodologies and/or techniques.

It should be realized that the processes and methodologies resident within the fourth and fifth steps of process 10 may be continuously and/or systematically repeated (e.g., each repetition comprising the use and/or employment of the fourth process step followed by the use and/or employment of the fifth process step), thereby further "growing" the circuit board and/or "pre-circuit" board assembly and lengthening the apertures 34, 36 and the recesses 38, 40 in the foregoing manner. Accordingly, this invention is not limited to a particular number of "layers" or component containing regions.

In this non-limiting embodiment, aperture 34 comprises a "non-ground metallized via" or a "non-grounded metallized through hole" since member 12, which selectively forms an electrical ground plane (i.e., member 12 is physically, selectively, and communicatively coupled to a source of electrical ground potential) within the formed circuit board, is discontinuous around or in the vicinity of the aperture 34. That is, the portion 37 of the member 12 which reside within the aperture 34 is disconnected from and/or is isolated from the remaining portions of member 12. Therefore, the electrical ground potential which is selectively applied to the member 12 is not communicated to and/or within the aperture 34. This disconnection and isolation is cooperatively accomplished by recesses 38, 40. Conversely, aperture 36 forms an electrically grounded metalized aperture or "via" since portion 39 of the member 12 which reside within the aperture 36 is selectively coupled to the electrical ground potential since portion 39 is integral to and/or is coupled to those portions of member 12 which receive the electrical ground potential. These formed apertures 34, 36 therefore allow for the selective and communicative interconnection by and between portions/members 12, 14, 16, and "pre-formed" circuits 42, 44, and/or by and between components which may be operatively contained upon and/or within these portions/members 12, 14, 16, and "pre-formed" circuits boards 42, 44.

In the sixth step of process 10, as shown best in FIG. 1(*f*), a commercially available and conventional plating resistant material 66 is applied to certain portions of the top and bottom surfaces 68, 70 of the "pre-circuit" assembly which was created upon the completion of the fifth process step. This plating resistant material 68 is not applied to the surface portions (such as portions 37, 39) residing within the apertures 34, 36 or to those portions of the surfaces 68, 70 proximate to the apertures 34, 36.

In the seventh step of process 10, as shown best in FIG. 1(*g*), commercially available and conventional plating material 72 is applied to each of the surfaces 37, 39 which are respectively contained within and/or which respectively "bound" apertures 34, 36 as well as upon those portions of surfaces 68, 70 to which the material 66 was not previously applied. The previously applied material 66 is then removed.

In the eighth and final step of process 10, as shown best in FIG. 1(*h*), a commercially available and conventional solder mask and surface finish material 74 is applied to the top and the bottom surface 68, 70 of the circuit assembly which was created in the seventh step of the process 10, as best shown in FIG. 1(*g*) and to the previously applied plating material 72 which respectively resides upon the surfaces 68, 70, thereby forming a multi-layer electrical circuit board assembly having at least one non-ground metallized aperture or "via" 34 and at least one electrically grounded metallized aperture or "via" 36 which are respectively formed by a process which obviates the need for drilling.

Referring now to FIGS. 2(*a*)–(*e*), there is shown a method and/or a process 80 for selectively forming a multi-layer electrical circuit board, in accordance with the teachings of a second embodiment of the invention. Particularly, as is more fully delineated below, process 80 employs an adhesive material which is selectively coupled and/or applied to a core member and which is later subjected to a photo imaging process which causes the adhesive material to be configured and/or formed in a desired pattern, thereby allowing apertures to be selectively formed within the core member without drilling.

As shown, process 80 employs an electrically conductive foil and/or core member 82 which may comprise copper or some other conventional and commercially available metal and which is generally rectangular in shape. As shown best in FIG. 2(*a*), an etchable adhesive material 84 is applied to the top and the bottom surface 86, 88 of the electrically conductive core member 82. In one non-limiting embodiment of the invention, the etchable adhesive material 84 substantially covers the top and bottom surfaces 86, 88. Particularly, as should be apparent to those of ordinary skill in the art, material 84 may be "rolled", sprayed, and/or coated upon the surfaces 86, 88 or applied in a "film form" to these core member surfaces 86, 88.

After the adhesive material 84 is applied to member 82 in the foregoing manner, the process 80 continues, as shown best in FIG. 2(*b*), with the step of applying a conventional and commercially available photo resistive material 90 upon the respective exposed surfaces 92, 94 of the applied adhesive material 84. In one non-limiting embodiment of the invention, the photo-resistive material 90 substantially covers the top and bottom surfaces 92, 94.

The previously applied photo resistive material 90 is then exposed and developed, in a known and conventional manner, to form exposed adhesive material portions of a selected and unique pattern. This pattern will vary depending upon the type of created circuit which is to be created and/or the type of application that the created circuit is to be used within. In one non-limiting embodiment, by way of example and without limitation, and as best shown in FIG. 2(*c*), portions of the previously applied material 90 are removed and exposed top surface adhesive material portions 96, 98 and exposed bottom surface adhesive material portions 100, 102, 104, and 106, are concomitantly created, thereby creating a "pre-circuit" board or assembly 108. In one non-limiting embodiment, exposed portions 96, 98, 100, 102, 104, and 106 respectively correspond to exposed portions 22, 24, 26, 28, 30, and 32 of process 10.

The fourth step of process 80 is shown best in FIG. 2(*d*) and, in this fourth process step, a second pre-circuit assembly 120 is created by subjecting pre-circuit assembly 108 to a commercially available etchant material which creates apertures through the exposed portions of the adhesive material 84. In this non-limiting example, apertures 110 and 112 are created and traverse or extend through the core member 82 and portions of the adhesive material 84 respectively residing upon surfaces 86, 88. In one non-limiting embodiment, aperture 110 extends through the aligned portions 96 and 102 and aperture 112 extends through the aligned portions 98 and 106. The etchant material also creates recesses 114, 116 which extend through portions of the adhesive material 84 residing upon surface 88 but which terminate within and/or upon the core member 82. In one non-limiting embodiment of the invention, recesses 114, 116 respectively correspond to recesses 38, 40 of the pre-circuit assembly which is created by process 10 and which is shown best in FIG. 1(*c*) and selectively extend through portions 100 and 104.

In the fifth step of process 80, which is shown best in FIG. 2(*e*), the photo resistive material 90 is removed from pre-circuit assembly 120 in a known manner, thereby creating a third pre-circuit assembly 122. Accordingly, pre-circuit assembly 122 may be further processed in accordance with the previously delineated steps of process 10 which are shown, for example and without limitation, in FIGS. 1(*c*), 1(*d*), 1(*e*), 1(*f*), 1(*g*), 1(*h*), thereby allowing for the creation of a substantially similar circuit board and/or assembly 64 as that which is created by process 10.

It should be realized that process 80, in this second non-limiting embodiment of the invention, allows for the creation of apertures 110, 112 and recesses 114, 116 without the need for drilling or screen printing, thereby providing for an overall relatively efficient and cost-effective circuit assembly process and which selectively produces a "pre-circuit board assembly" 122 which allows for the accurate and selective formation of conductive circuits or paths and, more particularly, for the accurate and selective formation of relatively thin conductive circuits or paths, thereby increasing the overall electrical circuit density of the created and/or produced circuit board assembly. It should also be apparent to those of ordinary skill in the art that aperture 110, by use of recesses 114, 116, may be isolated from an electrical ground potential which is or which may be applied to member 82 and that aperture 112 includes and/or is integrally formed within the portion of member 82 which is or which may be communicatively coupled to the electrical ground potential applied to member 82. Further, process 80 may be employed to create a wide variety of circuit boards and/or assemblies and that, in other non-limiting circuit applications, adhesive material 84 and photo resistive material 90 may be applied to one or a selective number of portions of each or of one of the surfaces 86, 88, thereby allowing for the selective creation of a wide variety of circuit assemblies and configurations and allowing for the selective creation of several such "grounded" and "non-grounded" apertures 110, 112.

Referring now to FIGS. 3(*a*)–(*e*) there is shown a circuit board and/or circuit board assembly creation process 130 which is made and/or undertaken in accordance with the teachings of a third embodiment of the invention. Particularly, as is more fully delineated below, process 130 requires the use of a core or central member 132 which is electrically conductive. In one non-limiting embodiment, core member 132 comprises copper or some other commercially available metal. Particularly, as is more fully delineated below, the core member 132 initially and selectively receives photo resistive material and is then subjected to a photo imaging process. The core member 132 is then made to selectively receive adhesive material which does not substantially "wet" the previously applied photo resistive material, thereby allowing a pattern of exposed core member regions to be created. Holes or apertures are then selectively formed in and/or by use of the exposed regions or portions of the core member 132 in accordance with a certain desired circuit board/assembly configuration or a circuit board application requirement and which may be further "processed" in accordance with previously delineated circuit board formation processes.

As shown best in FIG. 3(*a*), the first step of process 130 begins with the acquisition, creation, and/or use of a core and/or a foil member 132 which, in one non-limiting embodiment of the invention, is substantially identical to member 82. As further shown in FIG. 3(*a*), a commercially available photo resistive material 134 is initially applied to the top and bottom surfaces 136, 138 of the core and/or foil member 132. In one non-limiting embodiment of the invention, material 134 is substantially identical to material 90 of process 80.

In the second step of process 130, which is best shown in FIG. 3(*b*), the applied photo resistive material 134 is selectively exposed, developed, and/or etched in a known manner, effective to remove most of the applied material 134 from the core member 132, and to concomitantly allow the remaining material 134 to overlay only certain portions of surfaces 136, 138 in a particular and desired pattern. One non-limiting example of one such pattern is shown in FIG. 3(*b*). This non-limiting pattern is presented in order to exemplify certain features of this process 130 and should not limit the generality of this invention. Specifically, portions of material 134 which are "aligned" on opposed surfaces 136, 138 of member 132 (e.g., portions 134(*a*) and (*b*) and portions 134(*c*) and (*d*)) cooperatively allow for the formation of "vias" or "through holes" in the created circuit assembly while those "non-aligned" portions of material 134 (e.g., portions 134(*e*) and (*f*)) operatively allow for the formation of recesses within the created circuit assembly, as explained below. These portions 134(*e*) and 134(*f*) further cooperatively allow for the creation of a "non-grounded" via.

In the third step of process 130 which is best shown in FIG. 3(*c*), a substantially "non-wetting" or "dry" type of adhesive material 139 is applied to the exposed portions of surfaces 136, 138 (i.e., to those surfaces which do not have an/or contain material 134). In the preferred embodiment of the invention, material 139 does not "wet" the remaining photo-resistive material 134 (e.g., the remaining portions 134(*a*)–134(*f*)), is relatively easily removable, and "leaves" and/or selectively forms relatively "clean" and relatively "sharp" edges upon the material portions 134(*a*)–134(*f*) which it engages. In addition, the material 139 substantially retains its desirable dielectric attributes and/or properties for a substantial period of time after it is applied to the surfaces 136, 138.

In the fourth step of process 130, which is shown best in FIG. 3(*d*), the remaining photo resistive material 134 (e.g., the remaining portions 134(*a*)–134(*f*)) is (are) "stripped away" by a known method, thereby creating a "pre-circuit assembly" 140. In the fifth step of process 130, which is best shown in FIG. 3(*d*), the pre-circuit 140 is etched, thereby creating a pre-circuit assembly 142 having apertures 144, 146 respectively extending through the assembly 140 and, more particularly, through those respective portions of the "pre-circuit" assembly 142 previously occupied by aligned portions 134(*c*), 134(*d*); and 134(*a*), 134(*b*).

In one non-limiting embodiment of the invention, apertures 144, 146 respectively correspond to apertures 110, 112 of "pre-circuit assembly" or "pre-circuit board" 122. "Pre-circuit assembly" 142 further includes recesses 148, 149 which selectively and respectively extend through the position or regions previously occupied by material portions 134(*f*) and 134(*d*), and which terminate within the core member 132 (e.g., in one non-limiting embodiment, extending into member 132 a distance equal to about one half of the width of the core member 132). These recesses 148, 149 respectively correspond to recesses 114, 116 of "pre-circuit assembly" 120 and/or recesses 38, 40 of the pre-circuit which is shown in FIG. 1(*c*) and which is formed within process 10.

It should be appreciated that process 130 allows for the selective creation of a "pre-circuit" assembly 142 having apertures 144, 146 which are formed without the use of screen printing or drilling. Moreover, these apertures 144, 146, by the use of formed recesses 148, 149, may be electrically grounded (e.g. portions of the member 132 residing within and/or "bounding" the aperture 146 may be communicatively coupled to a source of electrical ground potential) or non-grounded (e.g., portions of member 132 residing within and/or "bounding" the aperture 144 may be isolated from the source of electrical ground potential applied to certain other portions of member 132). It should be further appreciated that pre-circuit 142 may be further subjected to the process steps shown in FIGS. 1(*c*), 1(*d*), 1(*e*), 1(*f*), 1(*g*), 1(*h*) and contained within and/or forming process 10, thereby allowing for the creation of a circuit board and/or assembly which is substantially similar to that circuit board assembly 64 which is produced by process 10.

Figure 4A:
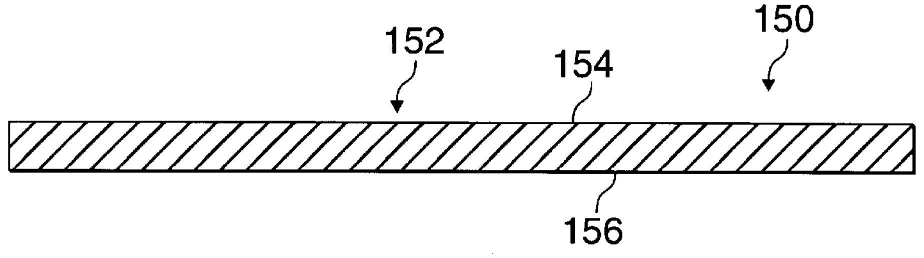
FIGS. 4(*a*)–(*c*) are successive sectional side views of a multi-layer circuit board being produced and/or formed in accordance with the teachings of a fourth embodiment of the invention.
Figure 4B:
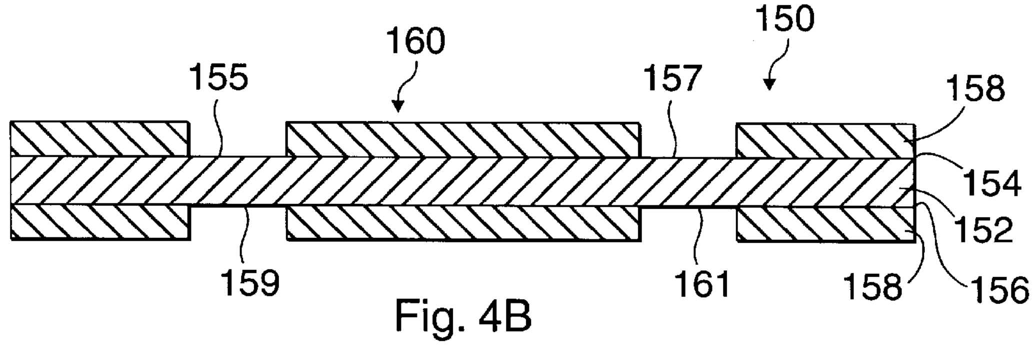
Figure 4C:
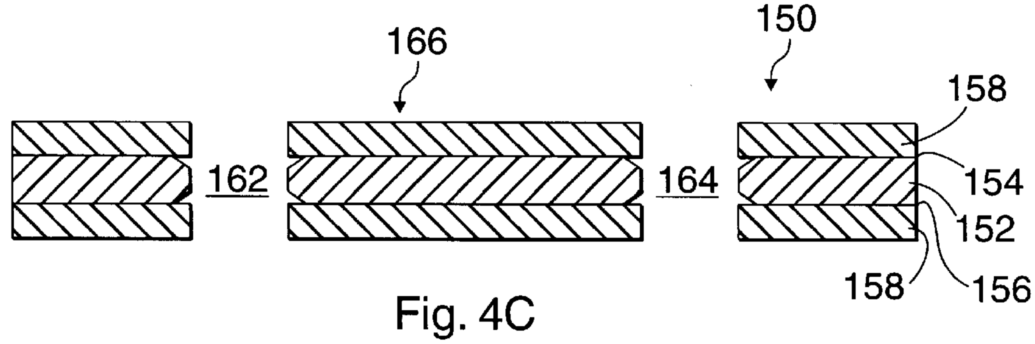

Referring now to FIGS. 4(*a*)–(*c*), there is shown a method and/or a process 150 for selectively forming a multi-layer electrical circuit board in accordance with the teachings of another alternate and non-limiting embodiment of the present invention. Specifically, as shown best in FIG. 4(*a*), the circuit board formation or creation process 150 begins with the acquisition of a core portion or member 152 having a top surface 154 and a bottom surface 156. In one non-limiting embodiment of the invention, member 152 comprises a conventional and commercially available electrically conductive material such as copper. In a further non-limiting embodiment of the invention, metal core portion 152 comprises conventional and commercially available aluminum. In one non-limiting embodiment of the invention, member or core portion 152 is substantially similar to members 12, 46, 48, or 50 as shown best in FIG. 1(*d*).

The second step of process 150, as shown best in FIG. 4(*b*), requires that a certain commercially available "photo imageable" layer of dielectric etch resistant material 158 be selectively applied to certain portions of the top surface 154 and the bottom surface 156 of the member 152, thereby forming a pre-circuit assembly 160.

In the third step of process 150, as shown best in FIG. 4(*c*), the pre-circuit assembly 160 is selectively immersed in a conventional and commercially available etchant material, effective to create apertures and/or perforations 162, 164 within core metal portion 152, thereby forming pre-circuit assembly 166. In one non-limiting embodiment, each of the apertures 162, 164 may each correspond to apertures 112 or 146. Alternatively, recesses may be selectively formed on each side of the aperture 162 or 164 in order to selectively cause the one aperture 162, 164 to selectively form a "non-grounded" aperture.

It should be appreciated that the pre-circuit assembly 166 may be formed in a variety of shapes and sizes. It should be further be appreciated that process 150 allows for the selective creation of a pre-circuit assembly 166 having apertures 162, 164 which are formed without the use of drilling. It should be further appreciated that pre-circuit assembly 166 may be further subjected to the process steps shown in FIGS. 1(*d*), 1(*e*), 1(*f*), 1(*g*), and 1(*h*) and contained within and/or forming process 10, thereby allowing for the creation of a circuit board and/or assembly which includes a pair of apertures or "through holes".

It should be understood that the invention is not limited to the exact embodiment or construction which has been illustrated and described but that various changes may be made without departing from the spirit and the scope of the invention.

What is claimed is:

1. A method for making a circuit board comprising the steps of:

providing a core member having a first surface and a second surface;

applying an etch resistant dielectric material to said first surface of said core member, thereby creating at least a first and a second exposed portion of said first surface of said core member;

applying an etch resistant dielectric material to said second surface of said core member, thereby creating at least a first, second, third, and fourth exposed portion of said second surface of the core member, the first exposed portion of the second surface and the second exposed portion of the second surface being respectively aligned with the first and second exposed portions of the first surface; and selectively applying an etchant material to said first and second surfaces of said core member, thereby creating a first aperture through said aligned first exposed portions of said first and second surfaces, creating a second aperture through said aligned second exposed portions of said first and second surfaces, creating a first recess which extends through said third exposed portion of said second surface of said core member and which terminates upon said etch resistant dielectric material residing upon said first surface of said core member, and creating a second recess which extends through said fourth exposed portion of said second surface of the core member and which terminates upon said etch resistant dielectric material residing upon said first surface of said core member, thereby forming a circuit board.

2. The method of claim 1 wherein said core member comprises an electrical ground plane.

3. The method of claim 2 wherein said core member comprises a metal of a certain type.

4. The method of claim 1 further comprising the steps of:

providing a pre-circuit assembly having a second core member having a first surface upon which plurality of portions formed from said certain type of metal are disposed, and a second surface upon which a second plurality of portions formed from said certain type of metal are disposed; and attaching said plurality of portions disposed upon said second surface of said pre-circuit assembly to said etch resistant material which is resident upon said first surface of said core member, effective to selectively allow said pre-circuit assembly to attachably overlay said formed circuit board.

5. The method of claim 4 further comprising the steps of:

providing a second pre-circuit assembly having a third core member having a first surface upon which a third plurality of portions formed from said certain type of metal are disposed; and attaching said plurality of portions disposed upon said first surface of said second pre-circuit assembly to said etch resistant material which is resident upon said second surface of said core member, effective to selectively allow said second pre-circuit assembly to attachably overlay said formed circuit board.

6. The method of claim 5 further comprising the steps of:

selectively applying an etchant material to certain portions of said first pre-circuit assembly, effective to selectively extend said first and second apertures through said first pre-circuit assembly; and selectively applying an etchant material to certain portions of said second pre-circuit assembly, effective to selectively extend said first and second apertures through said second pre-circuit assembly, thereby forming a fourth pre-circuit assembly.

7. The method of claim 6 wherein portions of said fourth pre-circuit assembly respectively reside within said first and said second apertures, said method further comprising the steps of:

plating those portions of said fourth pre-circuit assembly which reside within said first aperture; and plating those portions of said fourth pre-circuit assembly which reside within said second aperture.

8. The method of claim 7 wherein said fourth pre-circuit assembly has a first and a second surface, said method further comprising the steps of:

applying a solder mask to said first surface and to said second surface of said fourth pre-circuit assembly; and applying a surface finish material to the applied soldered mask, thereby creating a circuit board assembly.

9. A method for making a circuit board comprising the steps of:

providing a core member having a first and a second surface;

applying a photo resistive material to said to said first surface and said second surface;

removing portions of said previously applied photo resistive material, thereby creating at least a first, second, third, and fourth exposed portion of said first surface of said core member and further creating at least a fifth and a sixth exposed portion of said second surface, said fifth exposed portion being aligned with said second exposed portion and said sixth exposed portion being aligned with said fourth exposed portion; and selectively applying an etchant material to said core member, thereby creating a first aperture through said aligned fifth and second exposed portions and a second aperture through said aligned sixth and fourth exposed portions, creating a first recess which extends through said first exposed portion and which terminates within said core member, and creating a second recess which extends through said third exposed portion and which terminates within said core member, thereby forming a circuit board assembly.

10. The method of claim 9 wherein said core member comprises an electrical ground plane.

11. The method of claim 10 wherein said core member comprises metal of a certain type.

12. The method of claim 9 further comprising the steps of:

providing a pre-circuit assembly having a second core member having a first surface upon which plurality of portions formed from said certain type of metal are disposed, and a second surface upon which plurality of portions formed from said certain type of metal are disposed; and attaching said plurality of portions disposed upon said second surface of said pre-circuit assembly to said photo resistive material which is resident upon said first surface of said first metal core member, effective to selectively allow said pre-circuit assembly to attachably overlay said formed circuit board.

13. The method of claim 12 further comprising the steps of:

providing a second pre-circuit assembly having a third core member having a first surface upon which a plurality of portions formed from said certain type of metal are disposed; and attaching said plurality of portions disposed upon said first surface of said second pre-circuit assembly to said photo resistive material which is resident upon said second surface of said core member, effective to selectively allow said second pre-circuit assembly to attachably overlay said formed circuit board.

14. The method of claim 13 further comprising the steps of:

selectively applying an etchant material to certain portions of said first pre-circuit assembly, effective to selectively extend first and second apertures through said first pre-circuit assembly; and selectively applying an etchant material to certain portions of said second pre-circuit assembly, effective to selectively extend first and second apertures through said second pre-circuit assembly, thereby forming a fourth pre-circuit assembly.

15. The method of claim 14 wherein portions of said fourth pre-circuit assembly reside within said first and said second apertures, said method further comprising the steps of:

plating said those portions of said fourth pre-circuit assembly which reside within said first aperture; and plating said those portions of said fourth pre-circuit assembly which reside within said second aperture.

16. The method of claim 15 wherein said fourth pre-circuit assembly has a top and a second surface, said method further comprising the steps of:

applying a solder mask to said first surface and to said second surface of said fourth pre-circuit assembly; and applying a surface finish material to the applied soldered mask thereby creating a circuit board.

* * * * *